United States Patent
Shim et al.

(10) Patent No.: US 10,854,693 B2
(45) Date of Patent: Dec. 1, 2020

(54) ORGANIC LIGHT EMITTING DISPLAY DEVICE

(71) Applicant: LG Display Co., Ltd., Seoul (KR)

(72) Inventors: Sungbin Shim, Yangsan-si (KR); Eui-Doo Do, Paju-si (KR); Suhyeon Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 115 days.

(21) Appl. No.: 15/222,676

(22) Filed: Jul. 28, 2016

(65) Prior Publication Data

US 2017/0033166 A1    Feb. 2, 2017

(30) Foreign Application Priority Data

Jul. 29, 2015  (KR) .......................... 10-2015-0107497

(51) Int. Cl.
*H01L 27/32*    (2006.01)
*H01L 51/52*    (2006.01)
*H01L 51/56*    (2006.01)

(52) U.S. Cl.
CPC ...... *H01L 27/3246* (2013.01); *H01L 27/3279* (2013.01); *H01L 51/5228* (2013.01); *H01L 51/56* (2013.01); *H01L 27/3213* (2013.01); *H01L 2227/323* (2013.01)

(58) Field of Classification Search
CPC ............. H01L 27/3279; H01L 27/3246; H01L 51/5228
See application file for complete search history.

(56) References Cited

U.S. PATENT DOCUMENTS

| | | | |
|---|---|---|---|
| 2002/0089280 A1 | 7/2002 | Chung et al. | |
| 2005/0077816 A1* | 4/2005 | Yamada | H01L 51/5228 313/503 |
| 2009/0176337 A1* | 7/2009 | Kang | G03F 7/0007 438/151 |
| 2012/0205678 A1* | 8/2012 | Ikeda | H01L 27/3276 257/88 |
| 2014/0183479 A1* | 7/2014 | Park | H01L 51/56 257/40 |
| 2014/0312323 A1* | 10/2014 | Park | H01L 51/525 257/40 |

(Continued)

FOREIGN PATENT DOCUMENTS

| | | |
|---|---|---|
| CN | 103137891 A | 6/2013 |
| CN | 104124259 A | 10/2014 |

(Continued)

*Primary Examiner* — Lauren R Bell
(74) *Attorney, Agent, or Firm* — Birch, Stewart, Kolasch & Birch, LLP

(57) ABSTRACT

An organic light emitting display device can include a substrate; a first electrode and an auxiliary electrode disposed on the substrate; a bank pattern disposed on a part of an upper surface of the first electrode and the auxiliary electrode, in which the bank pattern is divided into a first area and a second area disposed under the first area; a barrier rib disposed on a part of the upper surface of the auxiliary electrode, in which the barrier rib is divided into a third area having a reverse-tapered shape and a fourth area disposed under the third area and having a tapered shape; an organic emission layer disposed on the substrate; and a second electrode disposed on the organic emission layer.

23 Claims, 13 Drawing Sheets

(56) References Cited

U.S. PATENT DOCUMENTS

| | | | |
|---|---|---|---|
| 2015/0001507 A1* | 1/2015 | Kim | H01L 27/3246 257/40 |
| 2015/0097171 A1* | 4/2015 | Kim | H01L 27/3246 257/40 |
| 2015/0179719 A1* | 6/2015 | Nam | H01L 27/3246 257/40 |

FOREIGN PATENT DOCUMENTS

| | | |
|---|---|---|
| CN | 104253144 A | 12/2014 |
| CN | 104517995 A | 4/2015 |
| CN | 104733500 A | 6/2015 |
| EP | 2503851 A1 | 9/2012 |
| EP | 2827371 A1 | 1/2015 |
| KR | 10-2016-0079523 A | 7/2016 |
| TW | 595249 B | 6/2015 |

\* cited by examiner

ORGANIC LIGHT EMITTING DISPLAY DEVICE

CROSS-REFERENCE TO RELATED APPLICATIONS

This application claims priority from Patent Application No. 10-2015-0107497 filed in the Republic of Korea on Jul. 29, 2015, which is hereby incorporated by reference for all purposes as if fully set forth herein.

BACKGROUND OF THE INVENTION

Field of the Invention

The present embodiments relate to an organic light emitting display device, and more particularly, to an organic light emitting display device which can be manufactured to a large size using a bank pattern and a barrier rib disposed on an auxiliary electrode.

Description of the Related Art

With progress of the information-oriented society, various types of demands for display devices for displaying an image are increasing. Recently, various types of display devices such as a liquid crystal display (LCD) device, a plasma display panel (PDP) device, or an organic light emitting display (OLED) device have been used. Such display devices respectively include display panels suitable therefor.

In the display panel, thin film transistors are formed in each pixel area and a specific pixel area in the display panel is controlled by a current flow in the thin film transistors. The thin film transistor includes a gate and source/drain electrodes.

In the OLED device, an emission layer is formed between two different electrodes, and when electrons generated from one of the electrodes and holes generated from the other one electrode are injected into the emission layer, the injected electrons and holes are combined into excitons. When the generated excitons transfer from an excited state to a ground state, lights are emitted to display an image.

Such an OLED device does not have a problem when manufactured to a small size. However, when manufactured to a large size, the OLED device has the problem of non-uniformity in brightness and has a brightness difference between a peripheral area and a central area. More specifically, if a current flows from a cathode electrode of an organic light emitting element to a space between the peripheral area and the central area, the current can travel far from a current injection point. In this instance, a voltage drop occurs due to a resistance of the cathode electrode of the organic light emitting element, which causes a brightness difference between the peripheral area and the central area.

That is, in a conventional OLED device having a large size, the uniformity in brightness is sharply decreased due to a brightness difference between a peripheral portion and a central portion caused by a resistance of an upper electrode of an organic light emitting element. Thus, the conventional OLED device needs a means to compensate the brightness difference.

Therefore, an auxiliary electrode (or an auxiliary line) which can be in contact with a cathode electrode has been introduced in order to solve the problem of voltage drop. However, it is difficult for the cathode electrode and the auxiliary electrode to be in contact with each other since an organic material is formed on the auxiliary electrode. Further, the organic material is formed to a large thickness in part, and, thus, a leakage current may be generated.

Also, recently, there has been an attempt to solve this problem by providing a barrier rib on the auxiliary electrode. However, a process for forming the barrier rib is additionally needed. Therefore, there has been a demand for a method for suppressing a leakage current and bringing a cathode electrode into contact with an auxiliary electrode without an additional process.

SUMMARY OF THE INVENTION

An aspect of the present embodiments provides an organic light emitting display device which can suppress a voltage drop caused by a resistance of a cathode when manufactured to a large size, and can also suppress generation of a leakage current and simplify a process.

According to an aspect of the present disclosure, there is provided an organic light emitting display device including: a substrate; a first electrode and an auxiliary electrode disposed on the substrate; a bank pattern disposed on the first electrode and a part of an upper surface of the auxiliary electrode and divided into a first area and a second area disposed under the first area; a barrier rib disposed on a part of the upper surface of the auxiliary electrode and divided into a third area having a reverse-tapered shape and a fourth area disposed under the third area and having a tapered shape; an organic emission layer disposed on the substrate; and a second electrode disposed on the organic emission layer.

Herein, the maximum width of the third area of the barrier rib may be greater than the maximum width of the fourth area of the barrier rib. Further, the first area of the bank pattern has a reverse-tapered shape, and the second area of the bank pattern has a tapered shape.

Furthermore, the organic emission layer includes first to third non-disposition areas. Herein, the first non-disposition area of the organic emission layer corresponds to partial areas of both lateral surfaces of the bank pattern. The second non-disposition area of the organic emission layer corresponds to both lateral surfaces of the third area of the barrier rib. The third non-disposition area of the organic emission layer corresponds to both lateral surfaces of the fourth area of the barrier rib and a part of the upper surface of the auxiliary electrode which is exposed by the organic emission layer.

According to the present embodiments, in the organic light emitting display device having a large size, the cathode electrode and the auxiliary electrode can be easily brought into contact with each other. Thus, a voltage drop caused by a resistance of the cathode electrode can be suppressed.

Further, according to the present embodiments, in the organic light emitting display device, the organic emission layer includes the first non-disposition area on a part of the lateral surfaces of the third area of the bank pattern. Thus, a leakage current caused by a change in thickness of the organic emission layer can be suppressed, and a process of forming the barrier rib can be simplified.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
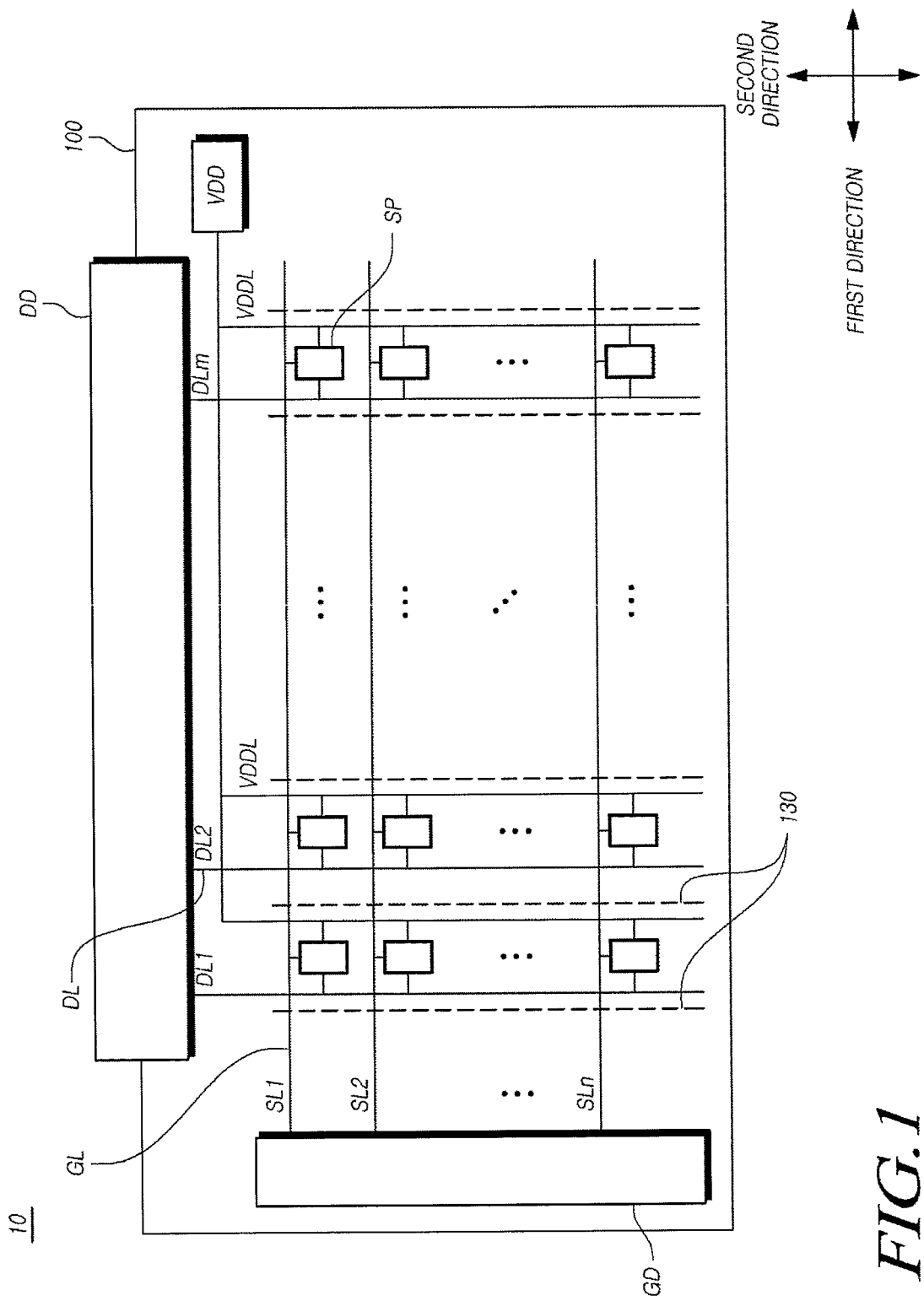
FIG. 1 is a view illustrating an organic light emitting display device according to an embodiment of the present disclosure.

Hereinafter, embodiments of the present disclosure will be described in detail with reference to the accompanying drawings. The embodiments introduced hereinafter are provided as examples in order to convey their spirits to a person having ordinary skill in the art. Therefore, the present disclosure is not limited to the following embodiments and can be embodied in a different shape. Also, the size and thickness of the device might be expressed to be exaggerated for the sake of convenience in the drawings. Like reference numerals generally denote like elements throughout the present specification.

Advantages and features of the present disclosure, and methods for accomplishing the same will be more clearly understood from embodiments described below with reference to the accompanying drawings. However, the present disclosure is not limited to the following embodiments but may be implemented in various different forms. The embodiments are provided only to complete disclosure of the present disclosure and to fully provide a person having ordinary skill in the art to which the present disclosure pertains with the category of the invention, and the present disclosure will be defined by the appended claims. Like reference numerals generally denote like elements throughout the present specification. In the drawings, the sizes and relative sizes of layers and regions may be exaggerated for clarity.

When an element or layer is referred to as being "on" another element or layer, it may be directly on the other element or layer, or intervening elements or layers may be present. Meanwhile, when an element is referred to as being "directly on" another element, any intervening elements may not be present.

The spatially-relative terms such as "below," "beneath," "lower," "above," and "upper" may be used herein for ease of description to describe the relationship of one element or components with another element(s) or component(s) as illustrated in the drawings. It will be understood that the spatially relative terms are intended to encompass different orientations of the element in use or operation, in addition to the orientation depicted in the drawings. For example, if the element in the drawings is turned over, elements described as "below" or "beneath" other elements would then be oriented "above" the other elements. Thus, the exemplary term "below" can encompass both an orientation of above and below.

The terms used herein are provided only for illustration of the embodiments but not intended to limit the present disclosure. As used herein, the singular terms include the plural reference unless the context clearly indicates otherwise. The terms "comprises" and/or "comprising" specify the presence of stated components, steps, operations, and/or elements, but do not preclude the presence or addition of one or more other components, steps, operations, and/or elements.

FIG. 1 is a view illustrating an organic light emitting display device according to an embodiment. Referring to FIG. 1, an organic light emitting display device 10 according to an embodiment includes a substrate 100, a gate driver GD, a plurality of gate lines GL, a data driver DD, a plurality of data lines DL, an auxiliary electrode 130, and a plurality of sub-pixels SP.

The substrate 100 may be an insulation substrate formed of plastic, glass, ceramic, and the like. If the substrate 100 is formed of plastic, the substrate 100 may be flexible. However, a material of the substrate 100 is not limited thereto. The substrate 100 may be formed of metal.

Further, the gate driver GD sequentially supplies a scan signal to the plurality of gate lines GL. For example, the gate driver GD is a control circuit and supplies a scan signal to the plurality of gate lines GL in response to a control signal supplied from a timing controller. Then, the sub-pixels SP are selected according to the scan signal and sequentially supplied with a data signal.

The plurality of gate lines GL is disposed on the substrate 100 and extended in a first direction. The gate lines GL include a plurality of scan lines SL1 to SLn. The plurality of scan lines SL1 to SLn is connected to the gate driver GD and supplied with a scan signal from the gate driver GD.

Furthermore, the data driver DD supplies a data signal to data lines DL1 to DLm selected from the data lines DL in response to a control signal supplied from the outside, such as the timing controller. The data signal supplied to the data lines DL1 to DLm is supplied to the sub-pixel SP selected according to a scan signal whenever the scan signal is supplied to the scan lines SL1 to SLn. Thus, the sub-pixel SP is charged with a voltage corresponding to the data signal and emits a light at a brightness corresponding thereto.

Herein, the data lines DL are disposed in a second direction so as to intersect with the gate lines GL. Further, the data lines DL include a plurality of data lines DL1 to DLm and include a driving power supply line VDDL. Further, the plurality of data lines DL1 to DLm is connected to the data driver DD and supplied with a data signal from the data driver DD. Furthermore, the driving power supply line VDDL is connected to an external first power supply VDD and supplied with driving power from the first power supply VDD.

Meanwhile, organic light emitting display devices are classified into top-emission, bottom-emission, and dualemission organic light emitting display devices. Herein, in any type of an organic light emitting display device, a voltage drop of a cathode electrode may occur while the cathode electrode is formed on the entire surface of a display panel having a large size. Thus, in order to solve this problem, an auxiliary electrode or an auxiliary line may be formed in a non-emission area. In the following, a top-emission display device will be described in the following embodiments. However, embodiments of the present disclosure are not limited to the top-emission display device, and can be applied to any display device capable of suppressing a voltage drop of a cathode electrode.

The auxiliary electrode 130 may be disposed on the substrate 100 so as to be in parallel with the plurality of data lines DL1 to DLm. That is, the auxiliary electrode 130 may be disposed in the second direction. Herein, more auxiliary lines in parallel with the data lines DL1 to DLm may be further disposed.

The auxiliary electrode 130 is not limited thereto, and may be disposed on the substrate 100 so as to be in parallel with the plurality of scan lines SL1 to SLn. That is, the auxiliary electrode 130 may be disposed in the first direction. Due to the auxiliary electrode 130, the organic light emitting display device 10 can suppress a voltage drop in response to a resistance of a cathode electrode of an organic light emitting element and a resultant brightness difference between a peripheral portion and a central portion.

Figure 2:
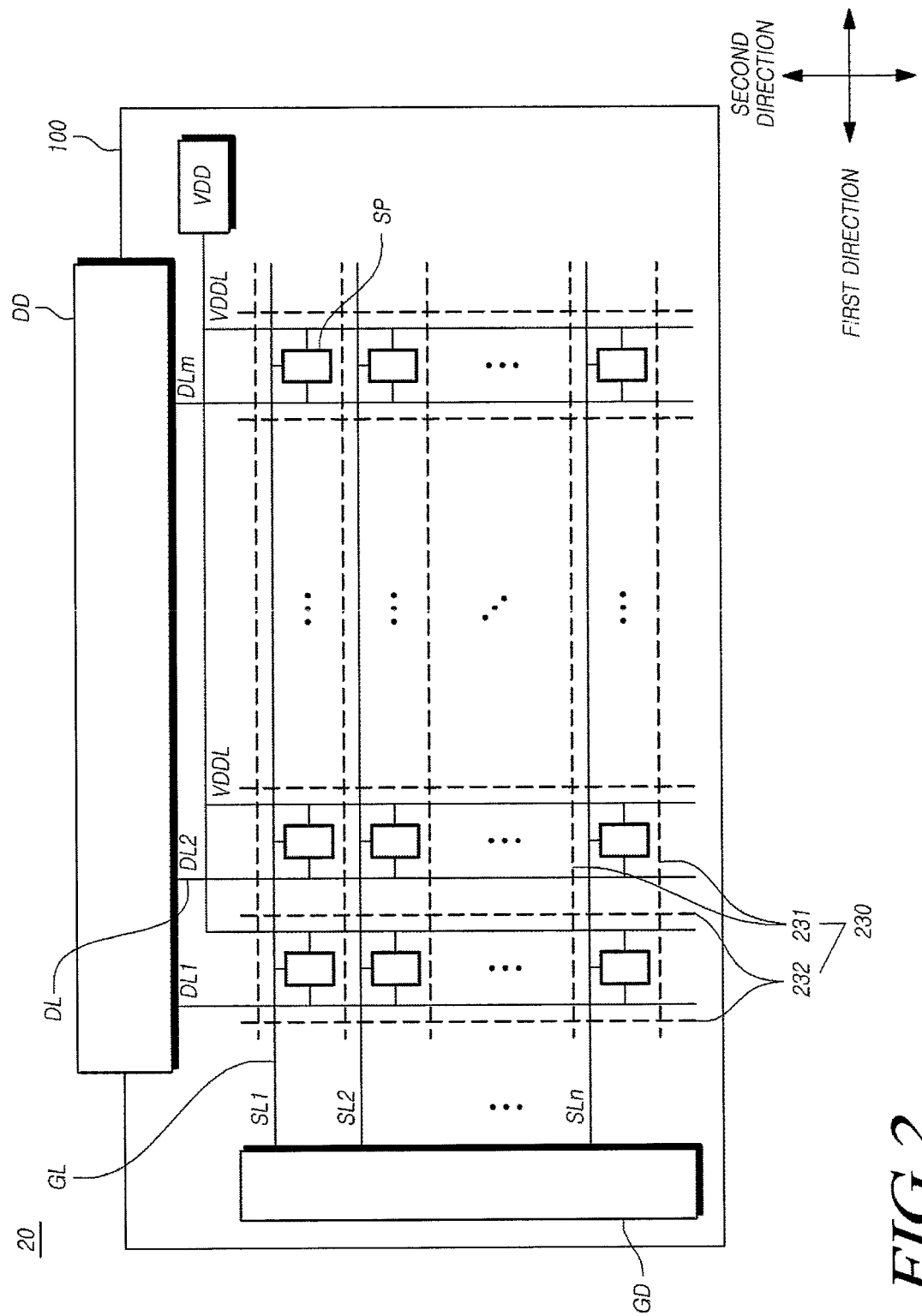
FIG. 2 is a view simply illustrating an organic light emitting display device according to another embodiment of the present disclosure.

Hereinafter, an organic light emitting display device according to another embodiment will be described with reference to FIG. 2. FIG. 2 is a view simply illustrating an organic light emitting display device according to another embodiment. The organic light emitting display device according to another embodiment of the present disclosure may include the same components as those of the above-described embodiment. The redundant description thereof may be omitted. Further, the same components will be assigned the same reference numerals.

Referring to FIG. 2, an organic light emitting display device 20 includes the plurality of scan lines SL1 to SLn disposed on the substrate 100 in the first direction and the data lines DL1 to DLm disposed in the second direction so as to intersect with the scan lines SL1 to SLn. Further, the organic light emitting display device 20 includes a plurality of auxiliary electrodes 230 disposed on the substrate.

Specifically, the organic light emitting display device 20 includes a plurality of first auxiliary electrodes 231 disposed in parallel with the plurality of scan lines SL1 to SLn and a plurality of second auxiliary electrodes 232 disposed in parallel with the plurality of data lines DL1 to DLm. That is, the auxiliary electrodes 230 may be disposed in a mesh form on the substrate 100. As such, the auxiliary electrodes 230 may be disposed in various forms. Further, auxiliary lines in parallel with the data lines DL1 to DLm may be further disposed. Due to the auxiliary electrodes 230, the organic light emitting display device 20 can suppress a voltage drop in response to a resistance of a cathode electrode of an organic light emitting element and a resultant brightness difference between a peripheral portion and a central portion.

Hereinafter, an organic light emitting display device including an auxiliary electrode and an auxiliary line will be described in detail with reference to FIG. 3 through FIG. 7.

Figure 3:
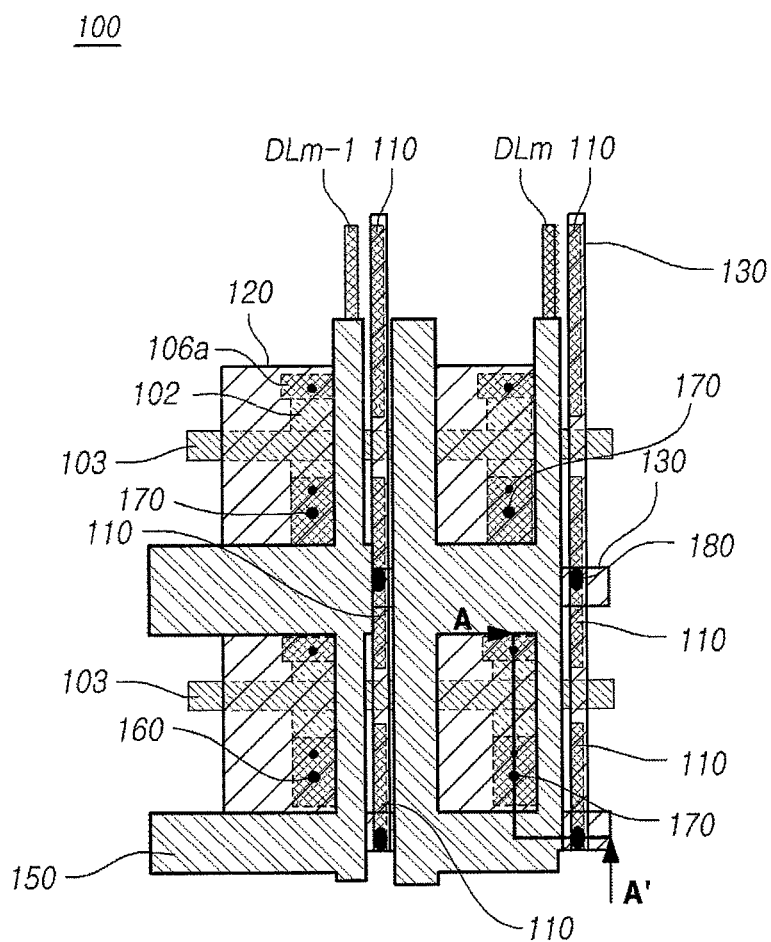
FIG. 3 is a plane view of an organic light emitting display device according to an embodiment of the present disclosure.
Figure 4:
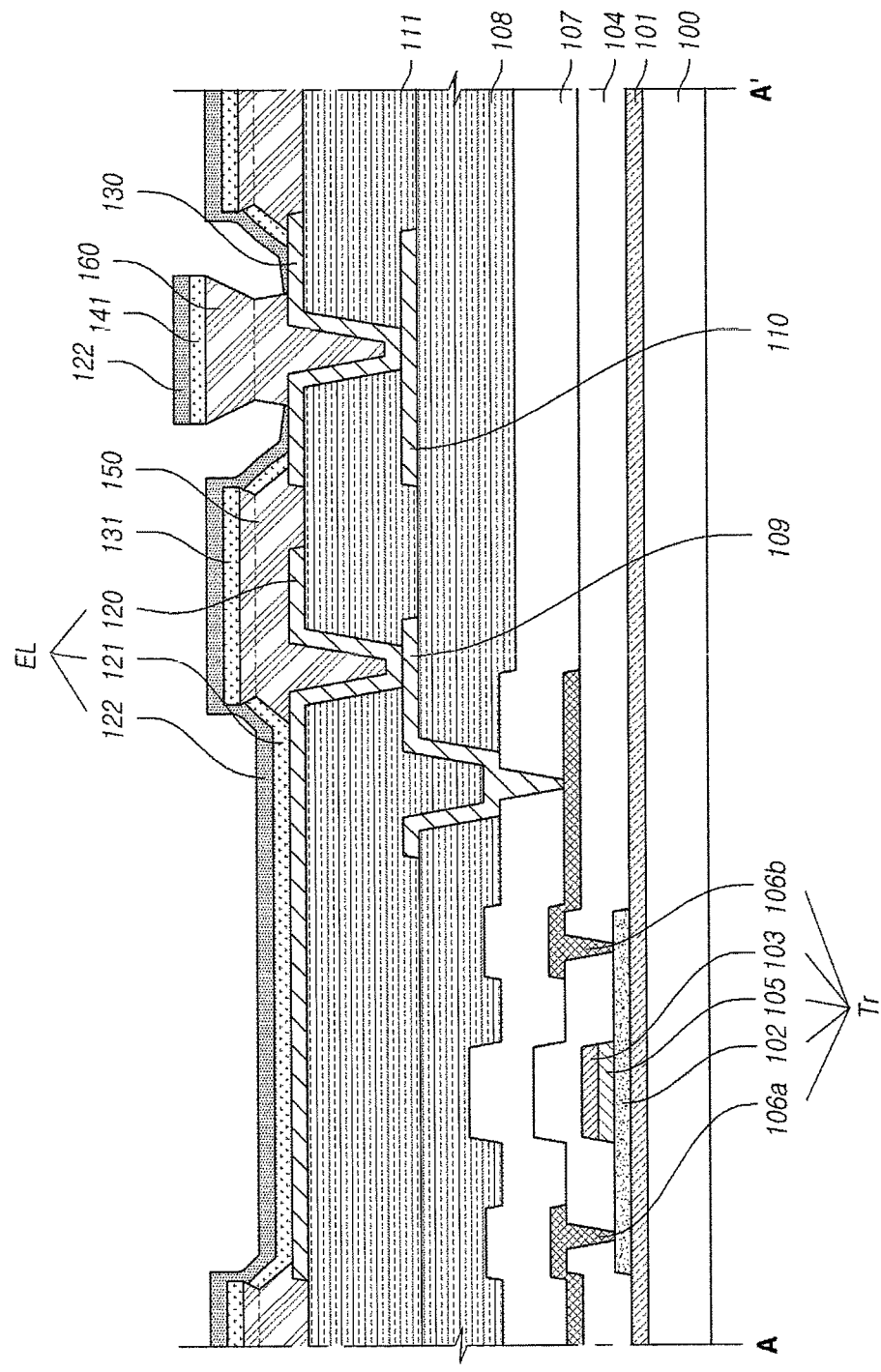
FIG. 4 is a cross-sectional view taken along a line A-A' of an organic light emitting display device according to an embodiment of the present disclosure.
Figure 5:
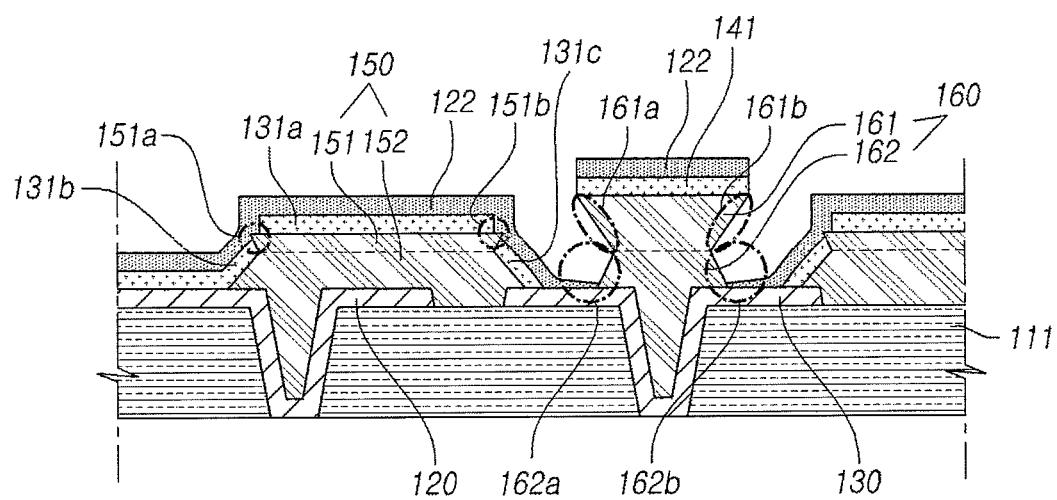
FIG. 5 is a view illustrating a bank pattern and a barrier rib of an organic light emitting display device according to an embodiment of the present disclosure.
Figure 6A:
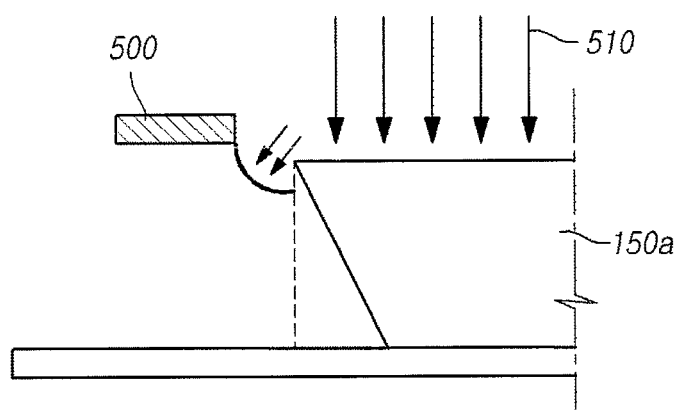
FIG. 6A through FIG. 6C are views illustrating a manufacturing method for a bank pattern and a barrier rib according to an embodiment of the present disclosure.
Figure 6B:
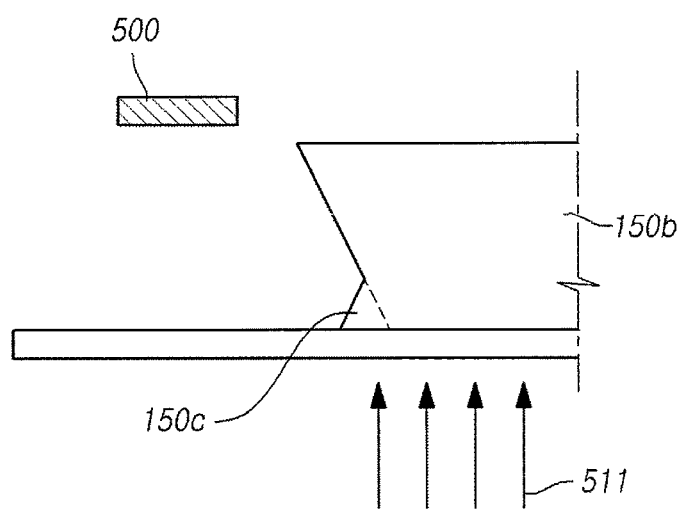
Figure 6C:
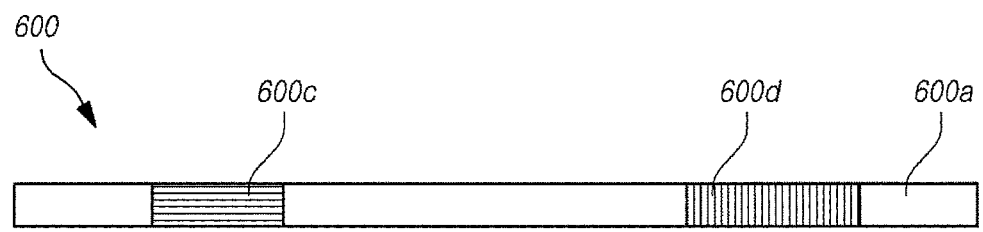
Figure 6C:
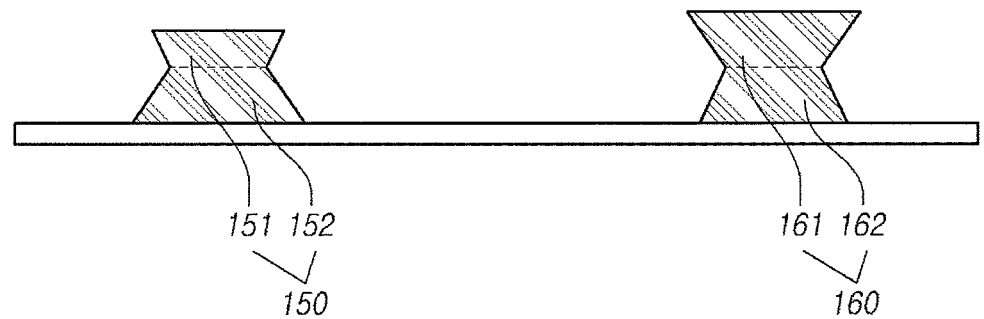
Figure 7:
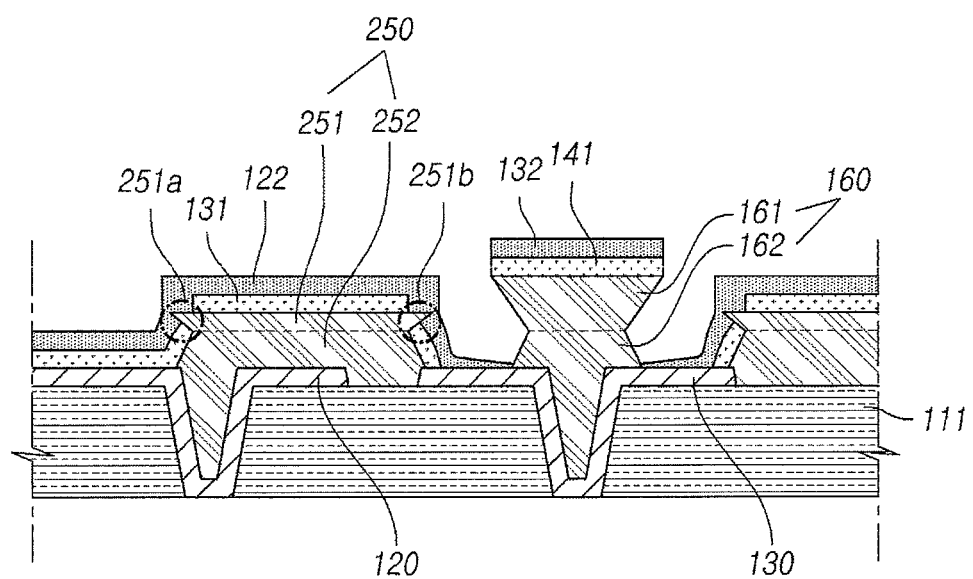
FIG. 7 is a view illustrating a bank pattern and a barrier rib of an organic light emitting display device according to another embodiment of the present disclosure.

FIG. 3 is a plane view of an organic light emitting display device according to an embodiment of the present disclosure. FIG. 4 is a cross-sectional view taken along a line A-A' of an organic light emitting display device according to an embodiment of the present disclosure. FIG. 5 is a view illustrating a bank pattern and a barrier rib of an organic light emitting display device according to an embodiment of the present disclosure. FIG. 6A through FIG. 6C are views illustrating a manufacturing method for a bank pattern and a barrier rib of the present disclosure. FIG. 7 is a view illustrating a bank pattern and a barrier rib of an organic light emitting display device according to another embodiment of the present disclosure.

Referring to FIG. 3, the organic light emitting display device according to an embodiment of the present disclosure includes an active layer 102 disposed on the substrate 100, a gate electrode 103, a data line DLm−1, DLm, a source electrode 106a branched from the data line DLm−1, DLm, a drain electrode 106b disposed to be separated from the source electrode 106a, and an auxiliary line 110 disposed on the same layer of connection electrode 109 which connects the source and drain electrodes 106a and 106b and formed of the same material as the source and drain electrodes 106a and 106b.

Further, a first electrode 120 of an organic light emitting element is in contact with the drain electrode 106b through a first contact hole 170 that exposes the drain electrode 106b. Herein, the first electrode 120 may be an anode electrode of the organic light emitting element.

Further, the auxiliary electrodes 130 are formed on the same layer and formed of the same material as the first electrode 120. The auxiliary electrodes 130 may be disposed in a horizontal direction and a vertical direction and thus disposed in a mesh form. However, a disposition form of the auxiliary electrodes 130 is not limited thereto, and the auxiliary electrodes 130 may be disposed in any one direction of the horizontal and vertical directions.

Further, the auxiliary line is in contact with the auxiliary electrode 130 through a second contact hole 180. Also, a bank pattern 150 is disposed so as to expose a part of the auxiliary electrodes 130. An area of the auxiliary electrode 130 which is not exposed by the bank pattern 150 is in contact with a second electrode of the organic light emitting element and thus suppresses a voltage drop of the second electrode. In addition, a barrier rib formed of the same material as the bank pattern 150 is disposed on the part of the auxiliary electrode 130 which is exposed by the bank pattern 150, in order to bring the auxiliary electrode 130 into contact with the second electrode.

The auxiliary electrodes contacting with the second electrode of the organic light emitting element according to embodiments of the present disclosure are located between pixel areas and formed of the same material as the first electrode, the source/drain electrodes, or a connection electrode M3 that electrically connect them. Thus, a process of forming an auxiliary line can be performed without an additional mask.

Further, the auxiliary electrode and the auxiliary line according to embodiments of the present disclosure are used without distinction. Also, while the auxiliary line is connected to the second electrode of the organic light emitting element by increasing a distance between the auxiliary electrode/auxiliary line and the organic emission layer, the auxiliary line and the second electrode can be connected due to a difference in step coverage between the organic emission layer and the second electrode material but the organic emission layer is not allowed to be introduced between the auxiliary line and the second electrode. Thus, a contact area between the auxiliary electrode and the second electrode can be increased.

Details thereof will be described below with reference to FIG. 4 as a cross-sectional view taken along the line A-A'.

Referring to FIG. 4, the substrate 100 includes a pixel area and a contact area. Herein, a thin film transistor Tr and an organic light emitting element EL are disposed on the pixel area of the substrate 100. Further, the auxiliary electrode 130 and a second electrode 122 are connected at the contact area of the substrate 100.

Specifically, a buffer layer 101 is disposed on the substrate 100, and the active layer 102 is disposed on the buffer layer 101. A gate insulation film 105 is disposed on a channel layer of the active layer 102. The gate electrode 103 is disposed on the gate insulation film 105.

The gate electrode 103 may be formed by laminating at least one of Cu, Mo, Al, Ag, Ti, or alloys formed of combinations thereof. However, a material of the gate electrode 103 is not limited thereto, and materials generally used for a gate electrode and a gate line may be used. Further, although the gate electrode 103 is illustrated as a single metal layer in the drawing, the gate electrode 103 may be formed by laminating at least two metal layers in some cases.

A first interlayer insulation film 104 is disposed on the gate electrode 103. Further, the source electrode 106a and the drain electrode 106b are disposed on the interlayer insulation film 104 so as to be separated from each other. The source electrode 106a and the drain electrode 106b are in contact with the active layer 102 through the first contact hole formed in the interlayer insulation film 104.

Herein, the source electrode 106a and the drain electrode 106b may be formed by laminating at least one of Cu, Mo, Al, Ag, Ti, and alloys formed of combinations thereof or ITO, IZO, and ITZO which are transparent conductive materials. However, materials of the source electrode 106a and the drain electrode 106b are not limited thereto, and the source electrode 106a and the drain electrode 106b may be formed of materials generally used for a data line. Further, although each of the source electrode 106a and the drain electrode 106b is illustrated as a single metal layer in the drawing, each of the source electrode 106a and the drain electrode 106b may be formed by laminating at least two metal layers in some cases. As such, the thin film transistor Tr may be disposed on the substrate 100.

In order to protect the source electrode 106a and the drain electrode 106b, a second interlayer insulation film 107 and a first flattening film 108 are disposed on the substrate 100 including the thin film transistor Tr. On the first flattening film 108, a connection electrode 109 connected to the drain electrode 106b of the thin film transistor Tr and the auxiliary line 110 on the same layer as the connection electrode 109 are disposed. Herein, the auxiliary line 110 may be formed of the same material as the connection electrode 109, but is not limited thereto. The auxiliary line 110 may be formed of the same material as the gate electrode 103 or the source/drain electrodes 106a and 106b.

The auxiliary line 110 is electrically connected to the second electrode 122 of the organic light emitting element EL and can suppress a voltage drop caused by a resistance of the second electrode 122. Herein, the auxiliary line 110 may be formed to a width and a thickness suitable for the organic light emitting display device in order to improve a voltage drop of the large-sized display device. Further, a resistance of the auxiliary line 110 can be calculated on the basis of a width, a length, a thickness, and a kind of a material of the auxiliary line 110.

The auxiliary line 110 is disposed on the first flattening film 108 as described above. Thus, the auxiliary line 110 is substantially flat, which means that the auxiliary line 110 is formed so as not to have a stepped portion. However, the auxiliary line 110 according to an embodiment of the present disclosure is not limited thereto. If the first flattening film 108 is not formed to a sufficiently large thickness, the first flattening film 108 may have a stepped portion due to the components disposed thereunder. Therefore, the auxiliary line 110 may also have a stepped portion.

Herein, since the auxiliary line 110 is disposed on the first flattening film 108, an effect of a parasitic capacitance which may be generated between the components of the thin film transistor Tr can be minimized. Therefore, the first flattening film 108 may be formed to a sufficiently large thickness to suppress a parasitic capacitance between the auxiliary line 110 and the components of the thin film transistor Tr.

Further, the auxiliary line 110 is disposed under the first electrode 120 of the organic light emitting element EL. Thus, the auxiliary line 110 may be formed regardless of a size of an area where the first electrode 120 is disposed. Therefore, a size of the area where the first electrode 120 is disposed can be increased, and, thus, an emission area can be further increased.

A second flattening film 111 is disposed on the substrate 100 including the connection electrode 109 and the auxiliary line 110. Herein, in order to connect the first electrode 120 of the organic light emitting element EL to the drain electrode 106b of the thin film transistor Tr, it is necessary to form a contact hole in the first flattening film 108 and the second flattening film 111. While the contact hole is formed, it is difficult to form the contact hole so as to expose the drain electrode 106b since a flattening film is formed as a double layer. Therefore, the connection electrode 109 is disposed between the first flattening film 108 and the second flattening film 111, and, thus, it becomes easy to electrically connect the drain electrode 106b and the first electrode 120.

Further, the first electrode 120 of the organic light emitting element EL in contact with the connection electrode 109 through the contact hole is disposed on the second flattening film 111. Furthermore, the auxiliary electrode 130 in contact with the auxiliary line 110 through the contact hole is disposed on the same layer as the first electrode 120.

Herein, the first electrode 120 may be formed of a transparent conductive material having a high work function. For example, the first electrode 120 may be formed of any one selected from the group consisting of ITO (Indium Tin Oxide), IZO (Indium Zinc Oxide), and ZnO. Although the first electrode 120 is illustrated as a single layer in the drawing, the first electrode 120 may be formed as a multi-layer including a reflective layer and a transparent conductive layer.

The auxiliary electrode 130 may be formed of the same material as the first electrode 120, but is not limited thereto. The auxiliary electrode 130 may be formed of the same material as the gate electrode 103, the source/drain electrodes 106a and 106b, the connection electrode 109, or the auxiliary line 110. The auxiliary electrode 130 may function to electrically connect the auxiliary line 110 and the second electrode of the organic light emitting element EL.

The bank pattern 150 may be disposed on both lateral surfaces of the first electrode 120 and the auxiliary electrode 130. That is, the bank pattern 150 may be disposed to expose a part of upper surfaces of the first electrode 120 and the auxiliary electrode 130. Further, a barrier rib 160 is disposed on the exposed part of the upper surface of the auxiliary electrode 130 of which the upper surface is exposed in part by the bank pattern 150. Herein, the barrier rib 160 may be disposed on the same layer as the bank pattern 150 and formed of the same material as the bank pattern 150.

Hereinafter, the shapes of the bank pattern 150 and the barrier rib 160 will be described in detail with reference to FIG. 5. Referring to FIG. 5, the bank pattern 150 includes a first area 151 having a reverse-tapered shape gradually increased in width from the substrate 100 and a second area 152 having a tapered shape gradually decreased in width from the substrate 100 and disposed under the first area 151. Further, the barrier rib 160 may include a third area 161 having a reverse-tapered shape and a fourth area 162 having a tapered shape and disposed under the third area 161.

Herein, the bank pattern 150 may be formed of a thermosetting negative photoresist. While the bank pattern 150 is formed using a thermosetting negative photoresist 150a (refer to FIG. 6A through FIG. 6C), as a distance between a mask 500 and the thermosetting negative photoresist 150a is increased during an exposure process, a light 510 is scattered from an end of the mask 500. Due to scattering of the light 510, an exposure amount is different between an end and a central portion of the thermosetting negative photoresist 150a. Thus, the thermosetting negative photoresist 150a can be formed into a reverse-tapered shape.

After the exposure process of the thermosetting negative photoresist 150a, a lower portion of a cured thermosetting negative photoresist 150b, 150c may be formed into a tapered shape through a heat treatment process of applying heat 511 of 300° C. or less. Specifically, the central portion of the thermosetting negative photoresist 150a is supplied with a sufficient exposure amount of light and thus completely initiated. However, the end of the thermosetting negative photoresist 150a is supplied with an insufficient exposure amount due to scattering of the light 510 and thus not sufficiently initiated as compared with the central portion. Then, the central portion of the thermosetting negative photoresist 150a which has been sufficiently initiated is first cured during the heat treatment process for curing the thermosetting negative photoresist 150a. The thermosetting negative photoresist 150b, 150c is developed.

By curing the thermosetting negative photoresist 150a while adjusting duration of the heat treatment, a protrusion 150c may be formed at the lower portion of the thermosetting negative photoresist 150b. Thus, an upper portion of the cured thermosetting negative photoresist may be formed into a reverse-tapered shape, and the lower portion of the thermosetting negative photoresist may be formed into a tapered shape.

Accordingly, the bank pattern 150b, 150c including both the reverse-tapered shape and the tapered shape may be formed. Further, a barrier rib pattern may be formed on the same layer as the bank pattern 150b, 150c through the same process of forming the bank pattern 150b, 150c.

The shapes of the bank pattern 150b, 150c and the barrier rib pattern formed as such may be finally determined through an exposure process using a half-tone mask 600. For example, a negative photoresist is formed on the bank pattern 150b, 150c and the barrier rib pattern, and the half-tone mask 600 including a shielding portion 600a, a transmissive portion 600d, and a semi-transmissive portion 600c is disposed on the substrate on which the negative photoresist is formed. Herein, the transmissive portion 600d transmits a light, and the semi-transmissive portion 600c less transmits a light than the transmissive portion 600d. The shielding portion 600a completely shields a light.

The transmissive portion 600d of the half-tone mask 600 is disposed corresponding to the barrier rib pattern and the semi-transmissive portion 600c is disposed corresponding to the bank pattern 150b, 150c. Further, the shielding portion 600a is disposed corresponding to the other area where the bank pattern 150b, 150c and the barrier rib are not disposed. The thermosetting negative photoresist formed on the area where the bank pattern 150b, 150c and the barrier rib are not disposed is removed using the half-tone mask 600. Then, the negative photoresist formed on the bank pattern 150b, 150c is ashed. In this instance, the negative photoresist disposed on the barrier rib is removed in part. Then, a part of the upper portion of the bank pattern 150b, 150c is etched using the negative photoresist remaining on the barrier rib as a mask. The photoresist may be a positive photoresist. In this instance, the pattern of the half-tone mask 600 may be formed in reverse.

After the exposure process and the development process using the half-tone mask 600, each of the bank pattern 150 and the barrier rib 160 may be formed to have both a reverse-tapered shape and a tapered shape. As such, the bank pattern 150 and the barrier rib 160 may be formed through the same process. However, a process of forming the bank pattern 150 and the barrier rib 160 of the present disclosure is not limited thereto. Any process capable of forming the bank pattern 150 and the barrier rib 160 to have a reverse-tapered shape and a tapered shape may be employed.

After the exposure process and the development process using the half-tone mask 600, the bank pattern 150 and the barrier rib 160 may be different in height. Herein, the heights of the bank pattern 150 and the barrier rib 160 having gone through the exposure process and the development process using the half-tone mask 600 may be changed depending on an exposure amount or duration of exposure and development. Specifically, the height of the barrier rib 160 may be higher than the height of the bank pattern 150. More specifically, a height of the third area 160 of the barrier rib 160 may be higher than a height of the first area 151 of the bank pattern 150.

Herein, only a part of the first area 151 of the bank pattern 150 is etched during the exposure process and the development process using the half-tone mask 600, a height of the second area 152 of the bank pattern 150 may be the same as a height of the fourth area 162 of the barrier rib 160. In this instance, the height of the second area 152 of the bank pattern 150 may be defined as a length from an upper surface of the first electrode 120 of the organic light emitting element EL to a contact point between the second area 152 and the first area 151 of the bank pattern 150. Further, the height of the fourth area 162 of the barrier rib 160 may be defined as a length from the upper surface of the first electrode 120 of the organic light emitting element EL to a contact point between the fourth area 162 and the third area 161 of the barrier rib 160.

That is, the second area 152 of the bank pattern 150 and the fourth area 162 of the barrier rib 160 have the same height and the height of the first area 151 of the bank pattern 150 is lower than the height of the third area 161 of the barrier rib 160. Thus, the overall height of the bank pattern 150 may be lower than the overall height of the barrier rib 160. Herein, since the height of the bank pattern 150 is lower than the height of the barrier rib 160, an open area between the bank pattern 150 and the barrier rib 160 may be formed to a large size. Thus, the second electrode 122 of the organic light emitting element EL may be disposed to a wide range on the exposed upper surface of the auxiliary electrode 130.

As illustrated in FIG. 4 and FIG. 5, an organic emission layer 131a, 131b, 131c, 141 of the organic light emitting element EL is disposed on the substrate 100 on which the bank pattern 150 and the barrier rib 160 are disposed. In this instance, the organic emission layer 121, 131a, 131b, 131c, 141 may be formed by a linear deposition or coating method.

For example, the organic emission layer 121, 131a, 131b, 131c, 141 may be formed by evaporation. The organic emission layer 121, 131a, 131b, 131c, 141 formed by the above-described method may include first non-disposition areas 151a and 151b, second non-disposition areas 161a and 161b, and third non-disposition areas 162a and 162b on the substrate 100.

Herein, the first non-disposition areas 151a and 151b of the organic emission layer 131a, 131b, 131c, 141 correspond to partial areas of both lateral surfaces of the first area 151 of the bank pattern 150. The second non-disposition areas 161a and 161b of the organic emission layer 131a, 131b, 131c, 141 correspond to both lateral surfaces of the third area 161 of the barrier rib 160. The third non-disposition areas 162a and 162b of the organic emission layer 131a, 131b, 131c, 141 correspond to both lateral surfaces of the fourth area 162 of the barrier rib 160 and a part of the upper surface of the auxiliary electrode 130 which is exposed by the organic emission layer 131a, 131b, 131c, 141.

Specifically, the organic emission layer 131a, 131b, 131c, 141 may be disposed on an upper surface of the bank pattern 150, parts of both lateral surfaces of the bank pattern 150, and an upper surface of the barrier rib 160. Herein, the organic emission layer 131b, 131c disposed on the parts of the both lateral surfaces of the bank pattern 150 may be disposed to expose an area of the first area 151 having a reverse-tapered shape where a taper angle is formed.

More specifically, since the organic emission layer 131a, 131b, 131c, 141 is formed by a linear deposition or coating method, the organic emission layer 131a, 131b, 131c, 141 is not formed on an area having a stepped portion or an area, such as the bank pattern 150, having a reverse-tapered structure. Therefore, the organic emission layer 131a, 131b, 131c, 141 is not deposited or coated on partial areas of the both lateral surfaces of the first area 151 of the bank pattern 150 where a taper angle is formed.

Further, the organic emission layer 131a, 131b, 131c, 141 is not deposited or coated around the barrier rib 160 having a reverse-tapered structure. Specifically, the organic emission layer 131a, 131b, 131c, 141 is formed only on an upper surface of the third area 161 of the barrier rib 160, but not formed on both lateral surfaces of the third area 161 of the barrier rib 160 and around the fourth area 162. More specifically, the organic emission layer 131a, 131b, 131c, 141 may be formed to expose the both lateral surfaces of the third area 161 and a part of the upper surface of the auxiliary electrode 130 around the fourth area 162.

The second electrode 122 of the organic light emitting element EL may be disposed on the substrate 100 on which the organic emission layer 131a, 131b, 131c, 141 is disposed. Herein, the second electrode 122 may be formed by a non-directional deposition or coating method. For example, the second electrode 122 may be formed by sputtering. Such a method has an excellent step coverage, and, thus, can easily form the second electrode 122 on a structure having a stepped portion or a reverse-tapered shape.

Therefore, the second electrode 122 can be easily disposed on the bank pattern 150 having a reverse-tapered shape and around the barrier rib 160. Specifically, the second electrode 122 may be disposed on any area except the both lateral surfaces of the third area 161 of the barrier rib 160. Herein, the second electrode 122 cannot be introduced between the both lateral surfaces of the third area 161 of the barrier rib 160. Thus, the second electrode 122 is not formed on the both lateral surfaces of the third area 161.

That is, the second electrode 122 may be disposed to contact the bank pattern 150 on the partial areas of the both lateral surfaces of the first area 151 of the bank pattern 150 where the organic emission layer 131a, 131b, 131c, 141 is not disposed. Further, the second electrode 122 may be disposed on the auxiliary electrode 130 of which the upper surface is exposed in part since the organic emission layer 131a, 131b, 131c, 141 is not disposed. That is, the second electrode 122 may be disposed to contact the part of the upper surface of the auxiliary electrode 130.

Herein, the second electrode 122 may be decreased in thickness around the both lateral surfaces of the first area 151 of the bank pattern 150, and may be decreased in thickness on the auxiliary electrode 130 around the fourth area 162 of the barrier rib 160. This is because while the second electrode 122 is formed, a pathway for a material of the second electrode 122 is blocked by the first area 151 of the bank pattern 150 having a reverse-tapered shape and the third area 161 of the barrier rib 160.

However, since the organic emission layer 131a, 131b, 131c, 141 is disposed to expose the part of the upper surface of the auxiliary electrode 130, the second electrode 122 and the auxiliary electrode 130 can be fully brought into contact with each other at the exposed area of the upper surface of the auxiliary electrode 130. Thus, a resistance of the second electrode 122 can be reduced.

In other words, since the first area 151 of the bank pattern 150 has a small height, the maximum width of the first area 151 of the bank pattern 150 may be smaller than the maximum width of the second area 152 of the bank pattern 150. Further, since the third area 161 of the barrier rib 160 has a greater height than the first area 151, the maximum width of the third area 161 may be greater than the maximum width of the fourth area 162 of the barrier rib 160.

Meanwhile, since the organic emission layer 131a, 131b, 131c, 141 is formed by a linear deposition or coating method, as the maximum widths of the first area 151 and the third area 161 having a reverse-tapered shape are increased, an area for the organic emission layer 131a, 131b, 131c, 141 is decreased. That is, as the heights and the maximum widths of the first area 151 and the third area 161 are increased, an area covered by the widest portions of the first area 151 and the third area 161 is increased. Thus, the area for the organic emission layer 131a, 131b, 131c, 141 formed by a linear deposition or coating method is decreased.

That is, since the maximum width of the third area 161 of the barrier rib 160 having a reverse-tapered shape is greater than the maximum width of the fourth area 162, introduction of a material of the organic emission layer 131a, 131b, 131c, 141 into an area where the auxiliary electrode 130 is disposed can be suppressed. Specifically, since the maximum width of the third area 161 is greater than the maximum width of the fourth area 162, the third area 161 may be formed to be overlapped with the second area 152 of the bank pattern 150 and a part of the upper surface of the auxiliary electrode 130 which is exposed by the fourth area 162 of the barrier rib 160. Thus, the third area 161 covers the part of the upper surface of the auxiliary electrode 130. Therefore, deposition or coating of the organic emission layer 131a, 131b, 131c, 141 on the entire surface of the auxiliary electrode 130 can be suppressed.

That is, the organic emission layer 131a, 131b, 131c, 141 may be disposed to expose the part of the upper surface of the auxiliary electrode 130. Therefore, it is possible to adjust an area where the second electrode 122 and the auxiliary electrode 130 can be brought into contact with each other depending on a height of the third area 161 of the barrier rib 160. Accordingly, it is possible to effectively reduce a resistance of the second electrode 122.

Further, a conventional organic emission layer is formed to a large thickness at a boundary between a bank pattern and a first electrode of an organic light emitting element, and, thus, has the problem of a leakage current at the boundary between the bank pattern and the first electrode. However, the bank pattern 150 according to an embodiment of the present disclosure includes the first area 151 having a reverse-tapered shape. Therefore, the organic emission layer 131a, 131b, 131c, 141 includes the first non-disposition areas 151a and 151b on the partial areas of the both lateral surfaces of the first area 151. Thus, it is possible to suppress generation of a leakage current. That is, the bank pattern 150 and the second electrode 122 are disposed to be in contact with each other in the first non-disposition areas 151a and 151b of the organic emission layer 131a, 131b, 131c, 141, and the configuration of the organic emission layer 131a, 131b, 131c, 141 that causes a leakage current is eliminated. Therefore, it is possible to suppress generation of a leakage current.

Further, since the maximum width of the first area 151 of the bank pattern 150 is smaller than the maximum width of the second area 152, the organic emission layer 131a, 131b, 131c, 141 may include the first non-disposition areas 151a and 151b at a boundary between the bank pattern 150 and the first electrode 120 in order not to affect an emission area. In other words, according to an embodiment of the present disclosure, even if the organic emission layer 131a, 131b, 131c, 141 includes a non-disposition area, an emission area is not decreased but generation of a leakage current is suppressed. Thus, it is possible to suppress generation of a dark spot or a bright spot.

Hereinafter, the shape of the bank pattern according to another embodiment of the present disclosure will be described with reference to FIG. 7. The organic light emitting display device according to another embodiment of the present disclosure may include the same components as those of the above-described embodiment. The redundant description thereof may be omitted. Further, the same components will be assigned the same reference numerals.

Referring to FIG. 7, a bank pattern 250 according to another embodiment of the present disclosure includes a first area 251 and a second area 252. The first area 251 of the bank pattern 250 is formed into a reverse-tapered shape, and the second area 252 of the bank pattern 250 is formed into a tapered shape.

In this instance, the maximum width of the first area 251 of the bank pattern 250 may be greater than the maximum width of the second area 252 of the bank pattern 250. Thus, first non-disposition areas 251a and 251b of the organic emission layer 131a, 131b, 131c, 141 may be increased in size. Therefore, it is possible to further suppress generation of a leakage current caused by a large thickness of the organic emission layer 131a, 131b, 131c, 141.

Figure 8:
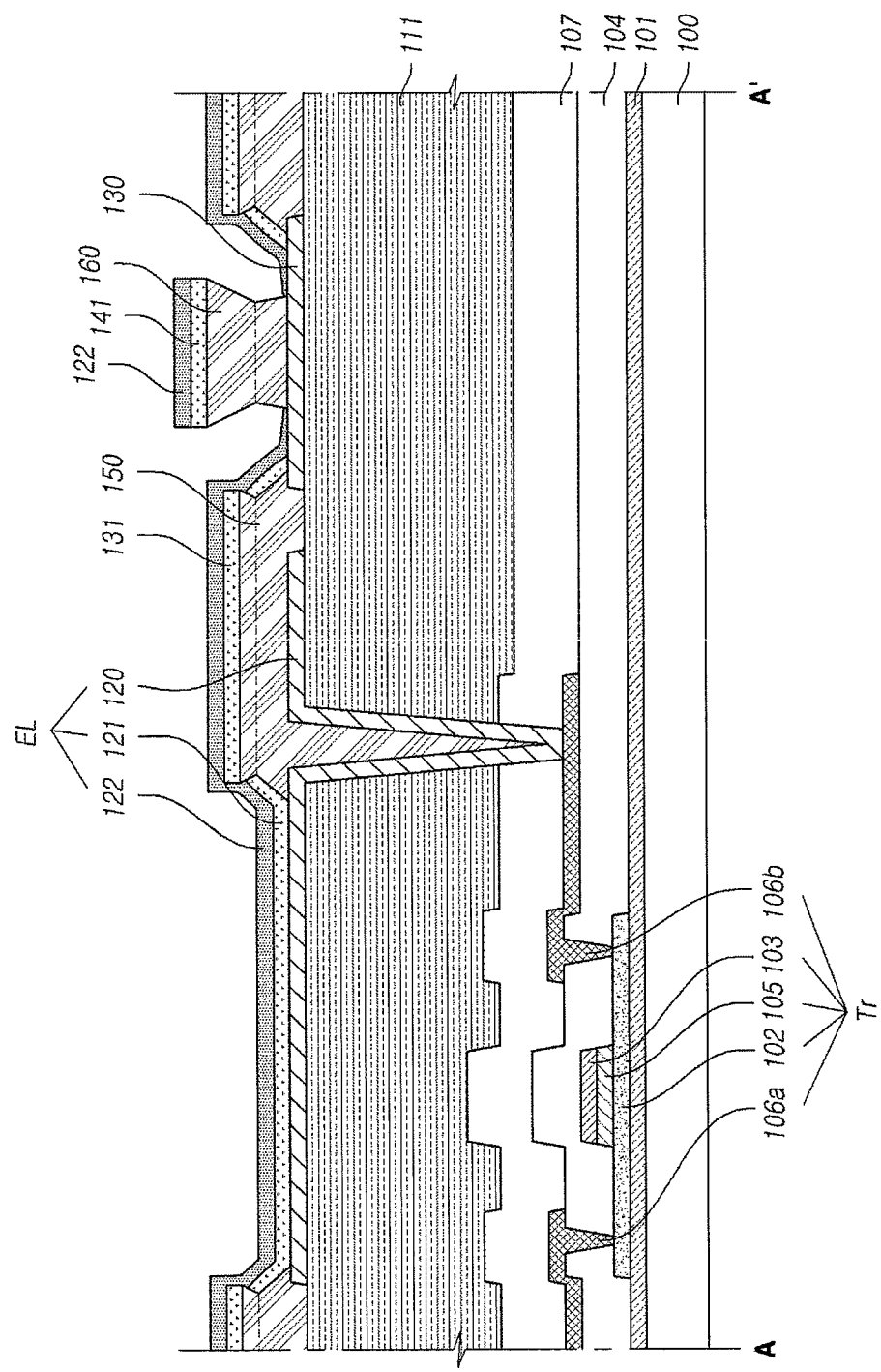
FIG. 8 is a cross-sectional view of an organic light emitting display device according to yet another embodiment of the present disclosure.

Hereinafter, an organic light emitting display device according to yet another embodiment of the present disclosure will be described with reference to FIG. 8. FIG. 8 is a cross-sectional view of an organic light emitting display device according to yet another embodiment of the present disclosure. The organic light emitting display device according to yet another embodiment of the present disclosure may include the same components as those of the above-described embodiment. The redundant description thereof may be omitted. Further, the same components will be assigned the same reference numerals.

FIG. 8 is a cross-sectional view illustrating that the second interlayer insulation film 108, the connection electrode 109, and the auxiliary line 110 illustrated in the cross-sectional view of FIG. 4 are excluded from the organic light emitting display device according to yet another embodiment of the present disclosure and the first electrode 120 of the organic light emitting element EL is directly connected to the drain electrode 106b of the thin film transistor Tr. Herein, since the second interlayer insulation film 108, the connection electrode 109, and the auxiliary line 110 are excluded, the number of masks and the number of processes can be reduced.

Figure 9:
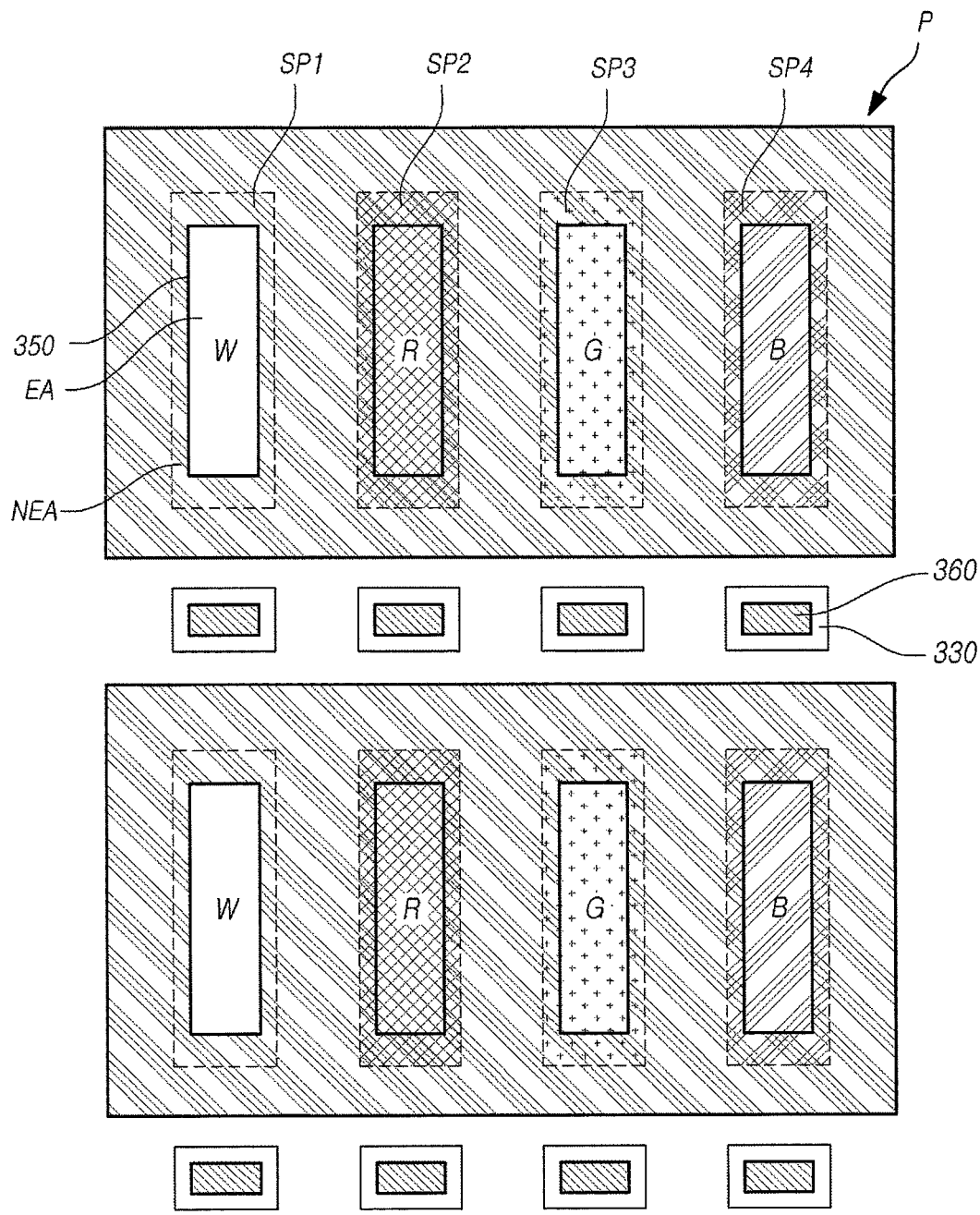
FIG. 9 is a plane view illustrating a disposition relationship between a sub-pixel and an auxiliary electrode according to an embodiment of the present disclosure.

Further, the auxiliary electrode and the barrier rib of the present disclosure may be disposed at various locations. Details thereof will be described with reference to FIG. 9 through FIG. 11. FIG. 9 is a plane view illustrating a disposition relationship between a sub-pixel and an auxiliary electrode according to an embodiment. Referring to FIG. 9, a plurality of pixel areas P is disposed on the substrate 100 of the organic light emitting display device. A plurality of sub-pixels is disposed on the pixel area P.

Specifically, the pixel area P may include a first sub-pixel SP1, a second sub-pixel SP2, a third sub-pixel SP3, and a fourth sub-pixel SP4. The pixel area P includes four sub-pixels in the drawing, but is not limited thereto. The pixel area P may include three sub-pixels.

Herein, the first sub-pixel SP1 may be a white (W) sub-pixel, the second sub-pixel SP2 may be a red (R) sub-pixel, the third sub-pixel SP3 may be a green (G) sub-pixel, and the fourth sub-pixel SP4 may be a blue (B) sub-pixel, but is not limited thereto.

Herein, the first to fourth sub-pixels SP1, SP2, SP3, and SP4 may be defined as an emission area EA and a non-emission area NEA by a bank pattern 350. That is, an area opened by the bank pattern 350 may be the emission area EA, and an area where the bank pattern 350 is disposed may be the non-emission area NEA. In this instance, the non-emission area NEA may include an area where an auxiliary electrode 330 is disposed.

Further, the auxiliary electrode 330 may be disposed under the first to fourth sub-pixels SP1, SP2, SP3, and SP4. That is, the single auxiliary electrode 330 may be included in each sub-pixel. Herein, the auxiliary electrode 330 may be disposed in parallel with a gate line, or may be disposed in parallel with a data line.

A barrier rib 360 may be disposed on a part of an upper surface of the auxiliary electrode 330. Herein, the bank pattern 350 and the barrier rib 360 may be disposed on the same layer and formed of the same material. Further, each of the bank pattern 350 and the barrier rib 360 may be formed to have both a reverse-tapered shape and a tapered shape.

Further, although the auxiliary electrode 330 is illustrated as being disposed under the first to fourth sub-pixels SP1, SP2, SP3, and SP4 in the drawing, the present disclosure is not limited thereto. The auxiliary electrode 330 may be disposed on an upper portion or a lateral portion of each sub-pixel. That is, in an embodiment of the present disclosure, the single auxiliary electrode 330 is sufficient for each sub-pixel. As such, since the auxiliary electrode 330 is disposed in each sub-pixel, a voltage difference of the organic light emitting display device can be controlled by unit of a sub-pixel.

Figure 10:
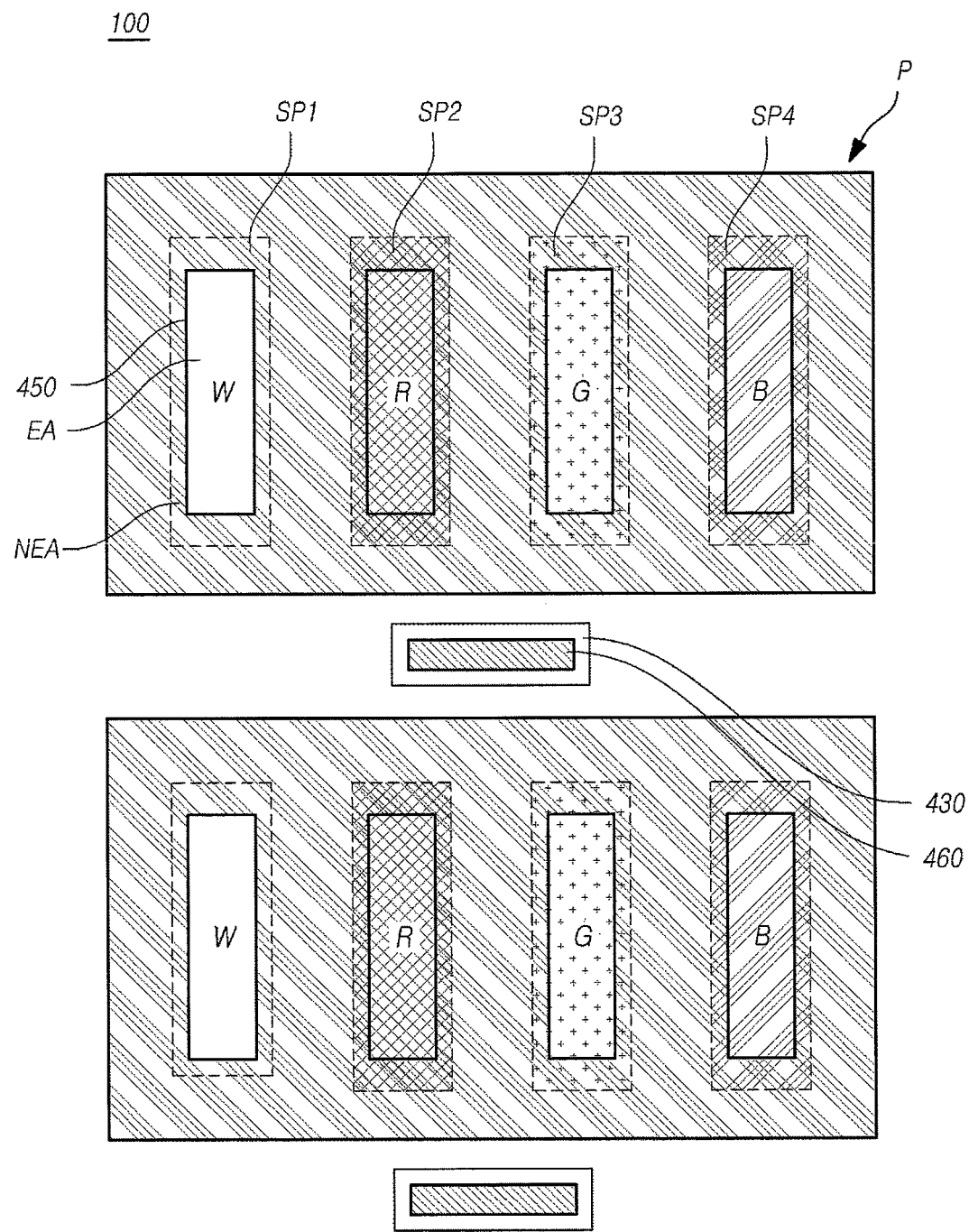
FIG. 10 is a plane view illustrating a disposition relationship between a sub-pixel and an auxiliary electrode according to another embodiment of the present disclosure.

FIG. 10 is a plane view illustrating a disposition relationship between a sub-pixel and an auxiliary electrode according to another embodiment. The organic light emitting display device according to another embodiment of the present disclosure may include the same components as those of the above-described embodiment. The redundant description thereof may be omitted. Further, the same components will be assigned the same reference numerals. Referring to FIG. 10, pixel areas P each including a plurality of sub-pixels SP1, SP2, SP3, and SP4 are disposed on the substrate 100.

Further, an auxiliary electrode 430 may be disposed under the pixel area P. That is, the single auxiliary electrode 430 may be included in each pixel area P. Herein, the auxiliary electrode 430 may be disposed in parallel with a gate line, or may be disposed in parallel with a data line.

A barrier rib 460 disposed on the same layer and formed of the same material as a bank pattern 450 may be disposed on the auxiliary electrode 430. Each of the bank pattern 450 and the barrier rib 460 may be formed to have both a reverse-tapered shape and a tapered shape.

Although the auxiliary electrode 430 is illustrated as being disposed under the pixel area P in the drawing, the present disclosure is not limited thereto. The auxiliary electrode 430 may be disposed on an upper portion or a lateral portion of the pixel area P. That is, in an embodiment of the present disclosure, the single auxiliary electrode 430 is sufficient for each pixel area P. As such, since the single auxiliary electrode 430 is disposed in each sub-pixel, a voltage difference of the organic light emitting display device can be controlled by unit of a pixel area.

Figure 11:
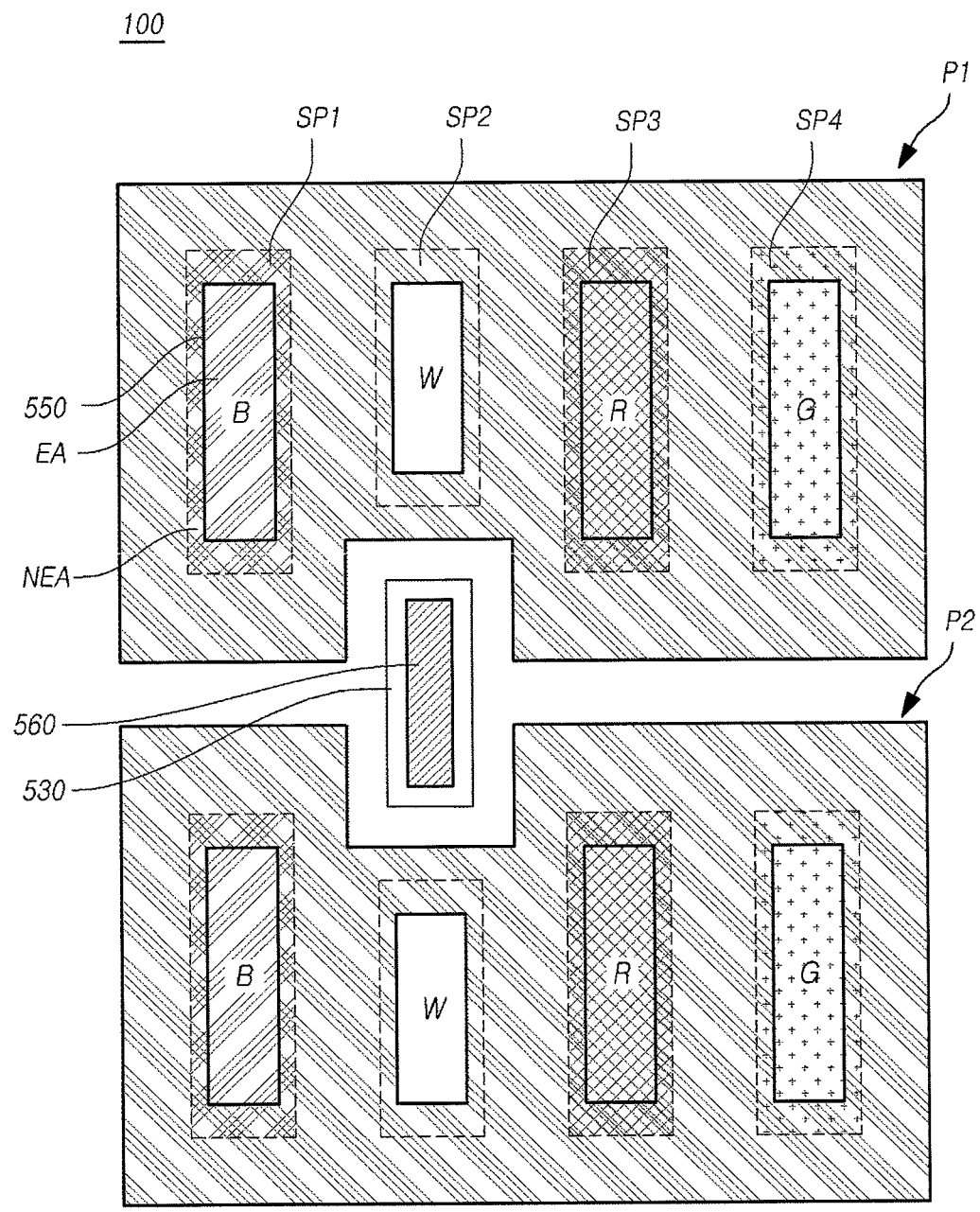
FIG. 11 is a plane view illustrating a disposition relationship between a sub-pixel and an auxiliary electrode according to yet another embodiment of the present disclosure.

FIG. 11 is a plane view illustrating a disposition relationship between a sub-pixel and an auxiliary electrode according to yet another embodiment. The organic light emitting display device according to yet another embodiment of the present disclosure may include the same components as those of the above-described embodiments. The redundant description thereof may be omitted. Further, the same components will be assigned the same reference numerals.

Referring to FIG. 11, a first pixel area P1 and a second pixel area P2 each including a plurality of sub-pixels SP1, SP2, SP3, and SP4 are disposed on the substrate 100. Herein, the first pixel area P1 and the second pixel area P2 are disposed to be adjacent to each other. For example, the first pixel area P1 may be located on the second pixel area P2.

Herein, an auxiliary electrode 530 may be disposed between the first pixel area P1 and the second pixel area P2. Specifically, the auxiliary electrode 530 may be disposed between one sub-pixel disposed in the first pixel area P1 and the corresponding sub-pixel disposed in the second pixel area P2.

For example, the auxiliary electrode 530 may be disposed between the second sub-pixel SP2 disposed in the first pixel area P1 and the second sub-pixel SP2 disposed in the second pixel area P2. Herein, the second sub-pixels SP2 may be white (W) sub-pixels.

Although the auxiliary electrode 530 is illustrated as being disposed between the white (W) sub-pixel in the first pixel area P1 and the white (W) sub-pixel in the second pixel area P2 in the drawing, the present disclosure is not limited thereto. The auxiliary electrode 530 may be disposed between a red (R) sub-pixel in the first pixel area P1 and a red (R) sub-pixel in the second pixel area P2. Otherwise, the auxiliary electrode 530 may be disposed between a green (G) sub-pixel in the first pixel area P1 and a green (G) sub-pixel in the second pixel area P2. Alternatively, the auxiliary electrode 530 may be disposed between a blue (B) sub-pixel in the first pixel area P1 and a blue (B) sub-pixel in the second pixel area P2.

A barrier rib 560 disposed on the same layer and formed of the same material as a bank pattern 550 may be disposed on the auxiliary electrode 530. Each of the bank pattern 550 and the barrier rib 560 may be formed to have both a reverse-tapered shape and a tapered shape.

Further, although the single auxiliary electrode 530 is illustrated as being disposed between two pixel areas in an embodiment of the present disclosure, the present disclosure is not limited thereto. A plurality of pixel areas may share the single auxiliary electrode 530. As such, since a plurality of pixel areas includes the auxiliary electrode 530, a voltage difference of the organic light emitting display device can be controlled by unit of a plurality of pixel areas.

The features, structures, effects, and the like described in the above embodiments are included in at least one embodiment and but are not limited to one embodiment. In addition, the features, structures, effects, and the like described in the respective embodiments may be executed by those skilled in the art while being combined or modified with respect to other embodiments. Accordingly, it will be understood that contents related the combination and modification will be included in the scope of the present disclosure.

Further, it should be understood that the embodiments described above should be considered in a descriptive sense only and not for purposes of limitation. It will be understood by those skilled in the art that various other modifications and applications may be made therein without departing from the spirit and scope of the embodiments. For example, respective components shown in detail in the embodiments may be executed while being modified.

What is claimed is:
1. An organic light emitting display device comprising:
a first electrode and an auxiliary electrode disposed on a substrate;
a bank pattern disposed on a part of the first electrode and on a part of the auxiliary electrode, wherein the bank pattern is divided into a first area having a reverse-tapered shape relative to the substrate, the reverse-tapered shape of the first area becoming narrower in a direction towards the substrate, and a second area below the first area having a tapered shape relative to the substrate, the tapered shape of the second area becoming wider in the direction towards the substrate, the second area being disposed between the first area and the substrate;
a barrier rib disposed on the auxiliary electrode, wherein the barrier rib is divided into a third area having a reverse-tapered shape relative to the substrate, the reverse-tapered shape of the third area becoming narrower in the direction towards the substrate, and a fourth area below the third area and having a tapered shape relative to the substrate, the tapered shape of the fourth area becoming wider in the direction towards the substrate, the fourth area being disposed between the third area and the substrate;
an organic emission layer disposed on the substrate except on an area of the auxiliary electrode adjacent to the barrier rib; and
a second electrode disposed on the organic emission layer and in contact with the auxiliary electrode,
wherein a first side surface of the bank pattern includes two different slopes, a second side surface of the bank pattern includes two different slopes, a first side surface of the barrier rib includes two different slopes, and a second side surface of the barrier rib includes two different slopes,
wherein the second side surface of the bank pattern is opposite to the first side surface of the bank pattern,
wherein the second side surface of the barrier rib is opposite to the first side surface of the barrier rib, wherein a height of the second area of the bank pattern is the same as a height of the fourth area of the barrier rib, and a height of an uppermost surface of the first area of the bank pattern is lower than a height of an uppermost surface of the third area of the barrier rib, wherein each of the first and second areas of the bank pattern extend from the first side surface of the bank pattern to the second side surface of the bank pattern, and wherein a portion of the first area of the bank pattern protrudes through the organic emission layer at each of the first side surface and the second side surface of the bank pattern.

2. The organic light emitting display device according to claim 1, wherein a maximum width of the first area of the bank pattern is smaller than a maximum width of the second area.

3. The organic light emitting display device according to claim 1, wherein a maximum width of the first area of the bank pattern is greater than a maximum width of the second area.

4. The organic light emitting display device according to claim 1, wherein a maximum width of the third area of the barrier rib is greater than a maximum width of the fourth area.

5. The organic light emitting display device according to claim 1, wherein the second electrode contacts the bank pattern at the both ends of the first area.

6. The organic light emitting display device according to claim 1, wherein the second electrode contacts an upper surface of the auxiliary electrode exposed by the bank pattern and the barrier rib.

7. The organic light emitting display device according to claim 1, wherein the second electrode is gradually decreased in thickness as the second electrode approaches the fourth area of the barrier rib.

8. The organic light emitting display device according to claim 1, further comprising:
an auxiliary line disposed under the auxiliary electrode.

9. The organic light emitting display device according to claim 1, wherein the substrate includes a plurality of sub-pixel areas, and the auxiliary electrode is disposed corresponding to each subpixel of the plurality of sub-pixel areas.

10. The organic light emitting display device according to claim 1, wherein the substrate includes pixel areas each of the pixel areas including three to four sub-pixels, and the auxiliary electrode is disposed corresponding to each of the pixel areas.

11. The organic light emitting display device according to claim 1, wherein the auxiliary electrode is disposed corresponding to two or more pixel areas.

12. The organic light emitting display device according to claim 1, wherein the auxiliary electrode is disposed in a mesh form on the substrate.

13. The organic light emitting display device according to claim 1, wherein the height of the second area of the bank pattern is defined as a length from an upper surface of the first electrode to a contact point between the second area and the first area of the bank pattern, and the height of the fourth area of the barrier rib is defined as a length from the upper surface of the first electrode to a contact point between the fourth area and the third area of the barrier rib.

14. The organic light emitting display device according to claim 1, wherein the organic emission layer includes discontinuous portions corresponding to the first area of the bank pattern at each of the first side surface and the second side surface of the bank pattern, and wherein the second electrode contacts the bank pattern at the discontinuous portions in the organic emission layer.

15. The organic light emitting display device according to claim 1, wherein the organic emission layer further includes:
discontinuous portions corresponding to each of the first side surface and the second side surface of the barrier rib.

16. An organic light emitting display device having a plurality of sub-pixels in a pixel, the organic light emitting display device comprising:
a first electrode and an auxiliary electrode on a substrate;
a bank pattern on the first electrode and the auxiliary electrode, and having a first area with a reverse-tapered shape relative to the substrate, the reverse-tapered shape of the first area becoming narrower in a direction towards the substrate, and a second area below the first area with a tapered shape relative to the substrate, the tapered shape of the second area becoming wider in the direction towards the substrate, the second area being disposed between the first area and the substrate;
a barrier rib on the auxiliary electrode, and having a third area with a reverse-tapered shape relative to the substrate, the reverse-tapered shape of the third area becoming narrower in the direction towards the substrate, and a fourth area below the third area with a tapered shape relative to the substrate, the tapered shape of the fourth area becoming wider in the direction towards the substrate, the fourth area being disposed between the third area and the substrate;
an organic emission layer on the substrate except on an area of the auxiliary electrode adjacent to the barrier rib; and
a second electrode on the organic emission layer and in contact with the auxiliary electrode,
wherein a first side surface of the bank pattern includes two different slopes, a second side surface of the bank pattern includes two different slopes, a first side surface of the barrier rib includes two different slopes, and a second side surface of the barrier rib includes two different slopes,
wherein the second side surface of the bank pattern is opposite to the first side surface of the bank pattern,
wherein the second side surface of the barrier rib is opposite to the first side surface of the barrier rib,
wherein a height of the second area of the bank pattern is the same as a height the fourth area of the barrier rib, and a height of an uppermost surface of the first area of the bank pattern is lower than a height of an uppermost surface of the third area of the barrier rib,
wherein each of the first and second areas of the bank pattern extend from the first side surface of the bank pattern to the second side surface of the bank pattern, and
wherein a portion of the first area of the bank pattern protrudes through the organic emission layer at each of the first side surface and the second side surface of the bank pattern, thereby suppressing a generation of leakage current, and the second electrode is in contact with the auxiliary electrode around the fourth area of the barrier rib, thereby reducing a resistance of the second electrode.

17. The organic light emitting display device according to claim 16, wherein the first area and second area of the bank pattern are made of a same material as the third area and the fourth area of the barrier rib.

18. The organic light emitting display device according to claim 16, wherein the bank pattern and the barrier rib are made of a thermosetting negative photoresist.

19. The organic light emitting display device according to claim 16, wherein the second electrode is in contact with the bank pattern at both ends of the bank pattern.

20. The organic light emitting display device according to claim 16, wherein a maximum width of the first area of the bank pattern is greater than a maximum width of the second area.

21. The organic light emitting display device according to claim 16, wherein a maximum width of the third area of the barrier rib is greater than a maximum width of the fourth area.

22. The organic light emitting display device according to claim 16, wherein the height of the second area of the bank pattern is defined as a length from an upper surface of the first electrode to a contact point between the second area and the first area of the bank pattern, and the height of the fourth area of the barrier rib is defined as a length from the upper surface of the first electrode to a contact point between the fourth area and the third area of the barrier rib.

23. The organic light emitting display device according to claim 16, wherein the organic emission layer includes discontinuous portions corresponding to the first area of the bank pattern at each of the first side surface and the second side surface of the bank pattern, and wherein the second electrode contacts the bank pattern at the discontinuous portions in the organic emission layer.

* * * * *